(12) United States Patent
Tsuda (10) Patent No.: US 11,393,696 B2
(45) Date of Patent: Jul. 19, 2022

(54) METHOD OF CONTROLLING SUBSTRATE TREATMENT APPARATUS, SUBSTRATE TREATMENT APPARATUS, AND CLUSTER SYSTEM

(71) Applicant: TOKYO ELECTRON LIMITED, Tokyo (JP)

(72) Inventor: Einosuke Tsuda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 361 days.

(21) Appl. No.: 16/773,234

(22) Filed: Jan. 27, 2020

(65) Prior Publication Data
US 2020/0243347 A1    Jul. 30, 2020

(30) Foreign Application Priority Data

Jan. 30, 2019  (JP) ............................. JP2019-014756

(51) Int. Cl.
| | | |
|---|---|---|
| *H01L 21/67* | (2006.01) | |
| *H01L 21/3213* | (2006.01) | |
| *H01J 37/32* | (2006.01) | |
| *C23C 14/02* | (2006.01) | |
| *C23C 14/50* | (2006.01) | |

(52) U.S. Cl.
CPC ...... *H01L 21/32137* (2013.01); *C23C 14/022* (2013.01); *C23C 14/50* (2013.01); *H01J 37/32522* (2013.01); *H01L 21/67069* (2013.01); *H01L 21/67248* (2013.01)

(58) Field of Classification Search
CPC ......... H01L 21/31116; H01L 21/67069; H01L 21/3065; H01L 21/02057; H01L 21/324; H01L 21/02164; H01L 21/67207
See application file for complete search history.

(56) References Cited

U.S. PATENT DOCUMENTS

| | | | |
|---|---|---|---|
| 2009/0011566 A1* | 1/2009 | Okada | H01L 29/665 257/E21.409 |
| 2009/0191707 A1* | 7/2009 | Okada | H01L 29/665 257/E21.477 |
| 2016/0005621 A1* | 1/2016 | Toda | H01L 21/67109 156/345.24 |
| 2016/0236244 A1* | 8/2016 | Takahashi | H01L 21/0206 |

FOREIGN PATENT DOCUMENTS

| | | |
|---|---|---|
| JP | 2005-244244 A | 9/2005 |
| JP | 2008-235309 A | 10/2008 |
| JP | 2018-032720 A | 3/2018 |
| WO | 2015147038 A1 | 10/2015 |

* cited by examiner

*Primary Examiner* — Jaehwan Oh
(74) *Attorney, Agent, or Firm* — Nath, Goldberg & Meyer; Jerald L. Meyer; Tanya E. Harkins (57) ABSTRACT

A method of controlling a substrate treatment apparatus including a chamber, a stage having elevation pins, a gas introducer disposed above the stage and introducing a treatment gas into the chamber, a first heating source heating the gas introducer, a stage elevator moving the stage up/down, and an elevator for elevation pins moving the elevation pins up/down, is provided. The method includes supporting a substrate having an oxide on the stage; etching the oxide using a treatment gas by supplying the treatment gas from the gas introducer; moving down the stage while maintaining a position of the substrate using the elevation pins; and sublimating a reaction product produced in etching the oxide by the first heating source.

20 Claims, 10 Drawing Sheets

METHOD OF CONTROLLING SUBSTRATE TREATMENT APPARATUS, SUBSTRATE TREATMENT APPARATUS, AND CLUSTER SYSTEM

CROSS-REFERENCE TO RELATED APPLICATION

This application is based upon and claims the benefit of priority from Japanese Patent Application No. 2019-014756, filed on Jan. 30, 2019, the entire contents of which are incorporated herein by reference.

TECHNICAL FIELD

The present disclosure relates to a method of controlling substrate treatment apparatus, a substrate treatment apparatus, and a cluster system.

BACKGROUND

Substrate treatment apparatuses that remove oxides formed on a substrate have been known.

In Patent Document 1, there has been disclosed a treatment chamber that removes silicon oxide of a substrate using ammonia and nitrogen trifluoride gas and that sublimates a thin film of ammonium hexafluorosilicate remaining on the surface of the substrate by lifting the substrate toward a heated distribution plate.

PRIOR ART DOCUMENT

Patent Document 1

Japanese Patent Application Publication No. 2005-244244

SUMMARY

According to the embodiments of the present disclosure, there is provided a method of controlling a substrate treatment apparatus including a chamber, a stage having elevation pins, a gas introducer disposed above the stage and introducing a treatment gas into the chamber, a first heating source heating the gas introducer, a stage elevator moving the stage up/down, and an elevator for elevation pins moving the elevation pins up/down, is provided. The method includes supporting a substrate having an oxide on the stage; etching the oxide using a treatment gas by supplying the treatment gas from the gas introducer; moving down the stage while maintaining a position of the substrate using the elevation pins; and sublimating a reaction product produced in etching the oxide by the first heating source.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, exemplary embodiments of the present disclosure will be described with reference to drawings. The same components are given the same reference numerals in the drawings and repeated description may be omitted.

First Embodiment

<Contact Forming System>

Figure 1:
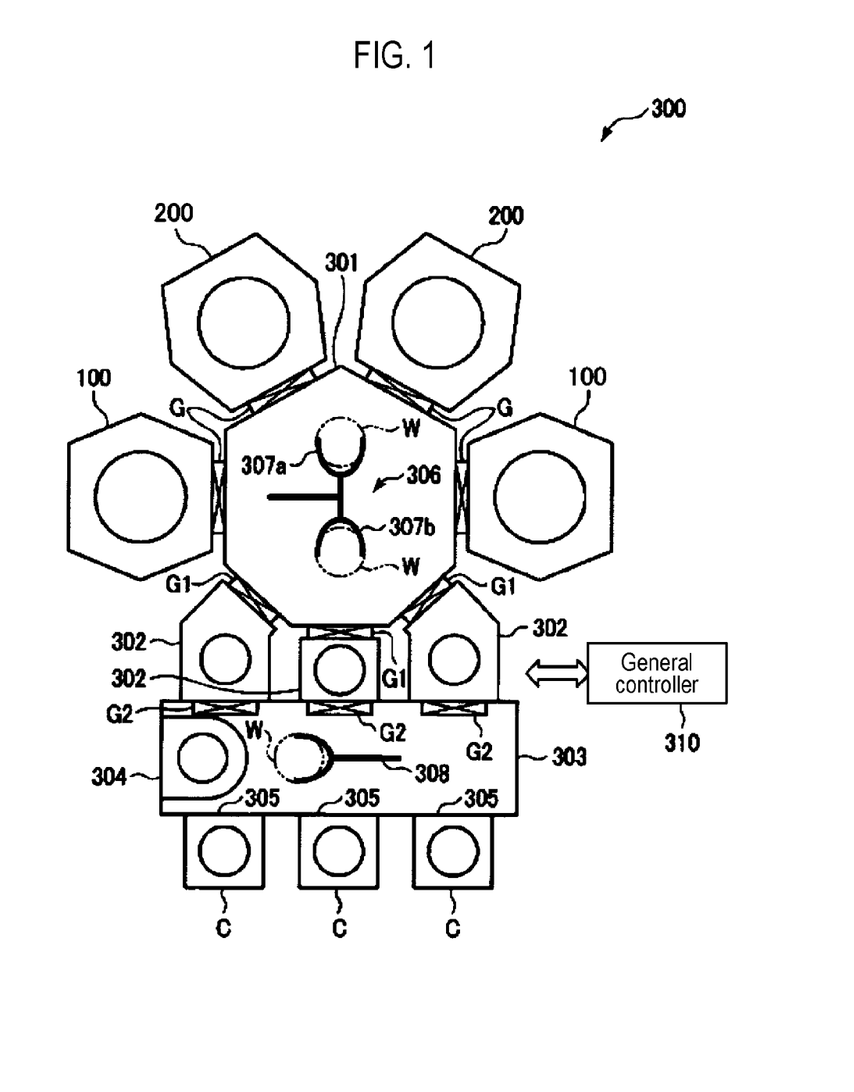
FIG. 1 is a configuration view of a contact forming system according to a first embodiment.

A contact forming system 300 according to a first embodiment is described with reference to FIG. 1. FIG. 1 is a configuration view of the contact forming system 300 according to the first embodiment. The contact forming system 300 is an apparatus that performs an oxide film removing treatment on a substrate W such as a wafer and then performs a metal film forming treatment on the substrate W, from which the oxide film has been removed.

As shown in FIG. 1, the contact forming system 300 includes two oxide film removing apparatuses 100 and two metal film forming apparatuses 200. The apparatuses are connected to four walls of a vacuum feed chamber 301 having a heptagonal plane shape through respective gate valves G. The vacuum feed chamber 301 is evacuated by a vacuum pump to maintain the inside thereof at a predetermined degree of vacuum.

The oxide film removing-apparatuses 100 are apparatuses that perform an oxide film removing treatment. A trench 3 (see FIG. 4A to be described below) is formed in a predetermined pattern on the wafer W. Further, a natural oxide film 4 (see FIG. 4A to be described below) is formed on a surface of a silicon portion at the bottom of the trench 3. In the oxide film-removing treatment, the natural oxide film 4 formed on the surface of the silicon portion at the bottom of the trench 3 of the substrate W is removed. The details of the oxide film removing apparatus 100 are described below with reference to FIG. 2, etc.

The metal film forming apparatus 200 is an apparatus that performs a metal film forming treatment. In the metal film forming treatment, a contact is formed by forming a metal film (e.g., a Ti film or a Ta film), which is a contact metal, on the silicon portion at the bottom of the trench 3 of the substrate W. The metal film-forming apparatus 200, for example, may be a Chemical Vapor Deposition (CVD) apparatus, an Atomic Layer Deposition (ALD) apparatus, or the like.

Further, three load lock chambers 302 are connected to the other three walls of the vacuum feed chamber 301 through respective gate valves G1. An atmospheric feed chamber 303 is provided opposite the vacuum feed chamber 301 with the load lock chambers 302 therebetween. The three load lock chambers 302 are connected to the atmospheric feed chamber 303 through respective gate valves G2. The load lock chambers 302 control pressure between the atmospheric pressure and vacuum when a substrate W is fed between the atmospheric feed chamber 303 and the vacuum feed chamber 301.

Three carrier mount ports 305 for mounting carriers C (FOUP, etc.) that accommodate substrates W are disposed on the wall of the atmospheric feed chamber 303 opposite to the wall to which the load lock chambers 302 are connected. Further, an alignment chamber 304 that aligns a substrate W is disposed on a side wall of the atmospheric feed chamber 303. A down flow of clean air is configured to be generated in the atmospheric feed chamber 303.

A feeder 306 is disposed in the vacuum feed chamber 301. The feeder 306 feeds a substrate W to the oxide film removing apparatuses 100, the metal film forming apparatuses 200, and the load lock chambers 302. The feeder 306 may include two feeding arms 307a and 307b which can move independently.

A feeder 308 is disposed in the atmospheric feed chamber 303. The feeder 308 is configured to feed a substrate W to the carriers C, the load lock chambers 302, and the alignment chamber 304.

The contact forming system 300 includes a general controller 310. The general controller 310 includes: a main controller having a CPU (computer) that controls components of the oxide film-removing apparatuses 100 and the metal film-forming apparatuses 200, an exhauster or the feeder 306 of the vacuum chamber 301, an exhauster or a gas supply of the load lock chambers 302, the feeder 308 of the atmospheric feed chamber 303, a driving mechanism for the gate valves G, G1, and G2, etc.; an input device (a keyboard, a mouse, etc.), an output device (a printer, etc.), a display device (a display, etc.), and a storage device (a storage medium). The main controller of the general controller 310 causes, for example, the contact forming system 300 to perform predetermined operations based on a treatment recipe stored in the recording medium disposed in the memory device or a recording medium set in the memory device. The general controller 310 may be a higher-level controller of controllers for respective units such as a controller 40 (see FIG. 2) to be described below.

Next, the operation of the contact forming system 300 having the configuration described above is described. The following treatment operation is performed based on the treatment recipe stored in the recording medium of the general controller 310.

First, the general controller 310 takes out a substrate from a carrier C connected to the atmospheric feed chamber 303 and then feeds the substrate W into the atmospheric feed chamber 303, using the feeder 308. The general controller 310 opens the gate valve G2 of one of the load lock chambers 302 and loads the substrate W held by the feeder 308 into the load lock chamber 302. After the feeding arms of the feeder 308 are retracted into the atmospheric feed chamber 303, the general controller 310 closes the gate valve G2 and evacuates air from the load lock chamber 302. Further, after the substrate W is taken out of the carrier C, the substrate W is aligned in the alignment chamber 304 before being fed into the load lock chamber 302.

When the inside of the load lock chamber 302 reaches a predetermined degree of vacuum, the general controller 310 opens the gate valve G1 of the load lock chamber 302, and then takes out the substrate W from the load lock chamber 302 and feeds the substrate W into the vacuum feed chamber 301 using the feeder 306. After the feeding arms of the feeder 306 are retracted into the vacuum chamber 301, the general controller 310 closes the gate valve G1.

The general controller 310 opens the gate valve G of one of the oxide film removing apparatuses 100 and loads the substrate W held by the feeder 306 into the oxide film removing apparatus 100. After the feeding arms of the feeder 306 are retracted into the vacuum chamber 301, the general controller 310 closes the gate valve G and performs an oxide film removing treatment using the oxide film removing apparatus 100.

After the oxide film removing treatment is finished, the general controller 310 opens the gate valve G of the oxide film removing apparatus 100, and then, using the feeder 306, takes out the substrate W from the oxide film removing apparatus 100 and feeds the substrate W into the vacuum chamber 301. After the feeding arms of the feeder 306 are retracted into the vacuum chamber 301, the general controller 310 closes the gate valve G of the oxide film removing apparatus 100.

The general controller 310 opens the gate valve G of one of the metal film forming apparatuses 200 and loads the substrate W held by the feeder 306 into the metal film forming apparatus 200. After the feeding arms of the feeder 306 are retracted into the vacuum chamber 301, the general controller 310 closes the gate valve G and performs a metal film forming treatment using the metal film forming apparatus 200. In the metal film forming treatment, a metal film (e.g., a Ti film or a Ta film) which is a contact metal is formed. At this time, the metal film reacts with the silicon at the bottom of the trench 3 to form a contact containing metal silicate (e.g., TiSi).

After the metal film forming treatment is finished, the general controller 310 opens the gate valve G of the metal film forming apparatus 200, and then, using the feeder 306, takes out the substrate W from the metal film forming apparatus 200 and feeds the substrate W into the vacuum chamber 301. After the feeding arms of the feeder 306 are retracted into the vacuum chamber 301, the general controller 310 closes the gate valve G of the metal film forming apparatus 200.

The general controller 310 opens the gate valve G1 of one of the load lock chambers 302 and loads the substrate W held by the feeder 306 into the load lock chamber 302. After the feeding arms of the feeder 306 are retracted into the vacuum feed chamber 301, the general controller 310 closes the gate valve G1 and returns the load lock chamber 302 into an atmospheric atmosphere.

When the load lock chamber 302 reaches a predetermined atmospheric atmosphere, the general controller 310 opens the gate valve G2 of the load lock chamber 302, and then, using the feeder 308, takes out the substrate W from the load lock chamber 302 and feeds the substrate W into the atmospheric feed chamber 303. After the feeding arms of the feeder 308 are retracted into the atmospheric feed chamber 303, the general controller 310 closes the gate valve G2 of the load lock chamber 302. Further, the general controller 310 returns the substrate W held by the feeder 308 into the carrier C.

The treatment described above is simultaneously performed on a plurality of substrates W in parallel, thereby completing a contact-forming treatment for a predetermined number of substrates W.

As described above, according to the contact forming system 300 of the first embodiment, it is possible to perform an oxide film removing treatment on a substrate W in the oxide film removing apparatus 100, feed the substrate W from the oxide film removing apparatus 100 into the metal film forming apparatus 200 while maintaining a vacuum atmosphere (without vacuum being breached), and then perform a metal film forming treatment on the substrate W, which has undergone the oxide film removing treatment, in the metal film forming apparatus 200. Accordingly, it is possible to form a low-resistance contact on the substrate W.

The contact forming system 300 shown in FIG. 1 is an exemplary configuration and is not limited to the configuration shown in FIG. 1. For example, a contact forming system may have a configuration in which the vacuum feed chamber 301, for example, has a polygonal plane shape rather than a heptagonal plane shape and the treatment apparatuses (the oxide film removing apparatus 100 and the metal film forming apparatus 200) are symmetrically disposed left and right.

<Oxide Film Removing Apparatus 100>

Figure 2:
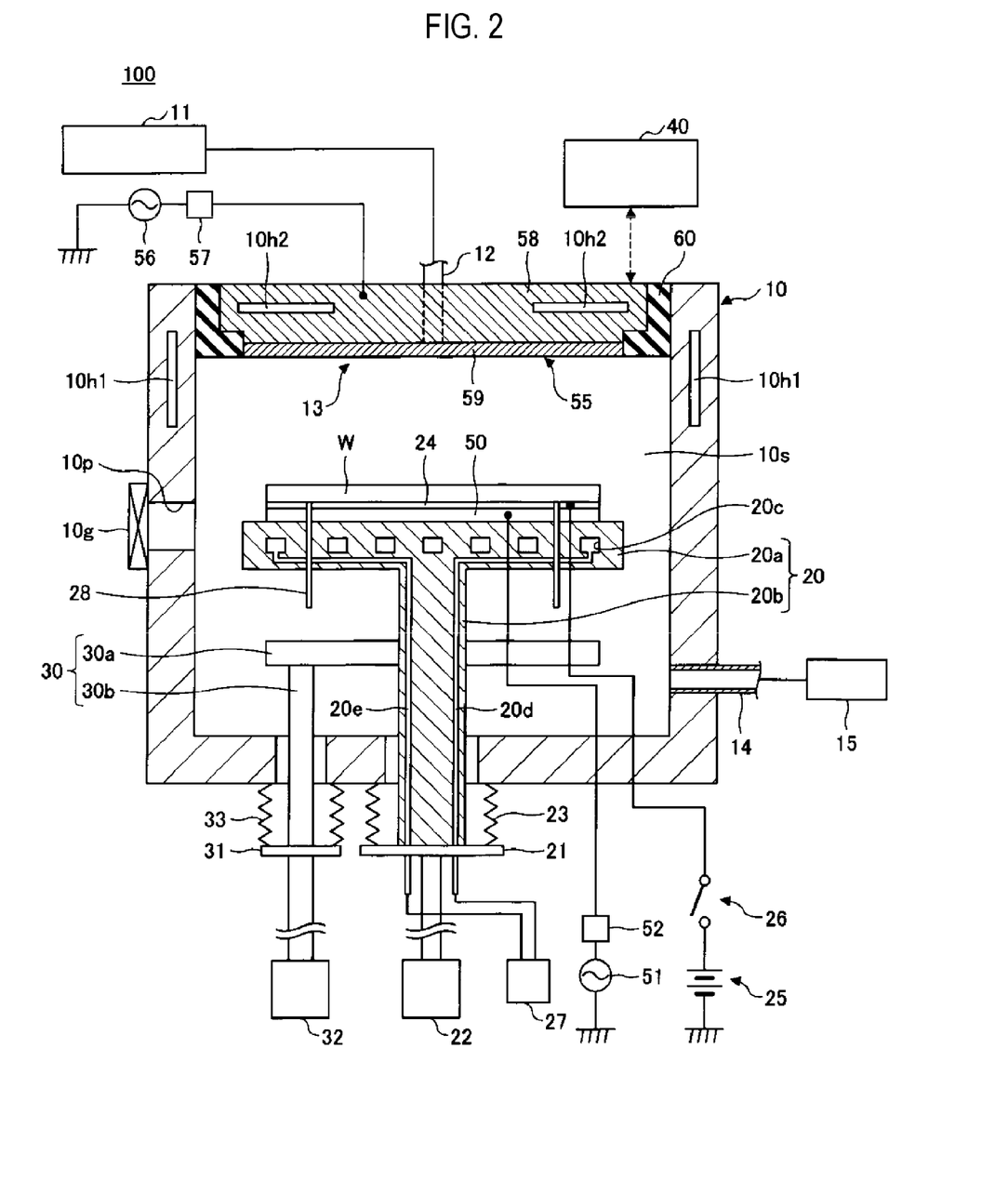
FIG. 2 is an exemplary schematic cross-sectional view of a substrate treatment apparatus according to the first embodiment.

Next, an example of the configuration of the oxide film removing apparatus 100 (a substrate treatment apparatus) according to the first embodiment is described with reference to FIG. 2. FIG. 2 is an exemplary schematic cross-sectional view of the oxide film removing apparatus 100 according to the first embodiment. The oxide film removing apparatus 100 shown in FIG. 2 is an apparatus that removes the natural oxide film 4 (see FIG. 4A to be described below) formed on the surface of the silicon portion before the metal film forming apparatus 200 forms a contact by forming a film of contact metal on the silicon portion at the bottom of the trench 3 (see FIG. 4A to be described below) of the substrate W. Further, the oxide film-removing apparatus 100 performs an anisotropic etching treatment for removing the natural oxide film 4 by a plasma treatment in one chamber 10, an ashing treatment for removing a protective film formed in the anisotropic etching treatment, a Chemical Oxide Removal (COR) treatment for removing the natural oxide film 4, and a Post Heat Treatment (PHT) for removing a reaction product 6 produced by the COR treatment.

The COR treatment is a process of performing chemical isotropic etching on a silicon oxide (natural oxide film 4) formed on a substrate W without using plasma by supplying a treatment gas into the chamber 10. For example, as the treatment gas, hydrogen fluoride gas (HF), ammonia gas ($NH_3$), argon gas (Ar), and nitrogen gas ($N_2$) are supplied. Accordingly, the silicon oxide reacts with the hydrogen fluoride gas and the ammonia gas, whereby ammonium fluorosilicate (($NH_4$)$SiF_6$) (AFS) is produced as a reaction product. The reaction product due to the COR treatment is deposited on the substrate W.

The PHT sublimates and removes the reaction product on a substrate W by heating the substrate W.

The oxide film removing apparatus 100 includes the chamber 10. The chamber 10 provides an internal space 10s therein. A passage 10p is formed through a side wall of the chamber 10. A substrate W is fed between the internal space 10s and the outside of the chamber 10 through the passage 10p. The passage 10p is opened/closed by a gate valve 10g formed along the side wall of the chamber 10. The chamber 10 is installed with a heater 10h1 that heats the side wall of the chamber 10.

The gas supply 11 includes a gas supply source, a flow rate regulating valve, an on-off valve, etc., and can switch a gas, which is supplied, in accordance with treatment processes. The gas supply 11 supplies the gas to a gas introducer 13 through a gas supply pipe 12 installed in the chamber 10. The gas supplied from the gas supply 11 is supplied to the internal space 10s from the gas introducer 13.

A gas exhauster 15 including an on-off valve, a vacuum pump, etc. is connected to a lower portion of the side wall of the chamber 10 through an exhaust pipe 14.

A stage 20 has a disc-shaped plate portion 20a and a shaft portion 20b extending downward from the plate portion 20a. The shaft portion 20b of the stage 20 passes through a bottom portion of the chamber 10. A lower end of the shaft portion 20b of the stage 20 is supported by an elevator 22 through an elevation plate 21 disposed under the chamber 10. A bellows 23 is disposed between the bottom of the chamber 10 and the elevation plate 21, and an airtight seal in the chamber 10 is maintained even though the elevation plate 21 moves up/down. The elevator 22 can move the stage 20 up/down by moving the elevation plate 21 up/down.

A lower electrode 50 is disposed on a top surface of the plate portion 20a of the stage 20. An electrostatic chuck 24 is disposed on a top surface of the lower electrode 50. A substrate W is placed on the top surface of the electrostatic chuck 24. The electrostatic chuck 24 has a main body and an electrode. The main body of the electrostatic chuck 24 has a substantially disc shape and is formed of a dielectric. The electrode of the electrostatic chuck 24 is a film-type electrode and is disposed in the main body of the electrostatic chuck 24. The electrode of the electrostatic chuck 24 is connected to a DC power source 25 through a switch 26. When a voltage is applied to the electrode of the electrostatic chuck 24 from the DC power source 25, electrostatic attraction force is generated between the electrostatic chuck 24 and a substrate W. The substrate W is retained on the electrostatic chuck 24 by the electrostatic attraction force. A first high-frequency power source 51 is connected to the lower electrode 50 through a matching box 52. The first high-frequency power source 51 is a power source that generates first high-frequency power. The first high-frequency power is used as high-frequency power for bias for inducing ions to the substrate W.

A coolant channel 20c is formed in the plate portion 20a and coolant channels 20d and 20e are formed in the shaft portion 20b. The coolant channel 20c has an end connected to the coolant channel 20d and the other end connected to the coolant channel 20e. The coolant channels 20d and 20e are connected to a coolant unit 27. The coolant unit 27 is, for example, a chiller unit. The coolant unit 27 is configured to be able to control the temperature of a coolant and supplies the coolant at a predetermined temperature to the coolant channel 20d. The coolant is supplied to the coolant channel 20c through the coolant channel 20d from the coolant unit 27. The coolant supplied to the coolant channel 20c returns to the coolant unit 27 through the coolant channel 20e. The temperature of the stage 20 can be controlled by circulating the coolant, for example, cooling water, etc., through the coolant channel 20c. The stage 20 may have a heater (not shown). As described above, the coolant unit 27 and the coolant channels 20c to 20e constitute a temperature adjuster of the stage 20. In the oxide film removing apparatus 100, the temperature of the substrate W retained on the electrostatic chuck 24 is adjusted by the temperature adjuster of the stage 20.

Elevation pins 28 support the bottom side of the substrate W and lift the substrate W from the loading surface of the electrostatic chuck 24. The elevation pins 28 are disposed in through-holes formed through the stage 20 and the electrostatic chuck 24. A contact member 30 is disposed under the elevation pins 28.

The contact member 30 has a contact portion 30a that comes in contact with the elevation pins 28 and a shaft portion 30b extending downward from the contact portion 30a. The shaft portion 30b of the contact member 30 passes through a bottom portion of the chamber 10. The lower end of the contact member 30 is supported by an elevator 32 through an elevation plate 31 disposed under the chamber 10. A bellows 33 is disposed between the bottom of the chamber 10 and the elevation plate 31, and the chamber 10 is kept hermetically sealed as the elevation plate 31 moves up/down. The elevator 32 can move the contact member 30 up/down by moving the elevation plate 31 up/down. When the lower ends of the elevation pins 28 come in contact with the top of the contact member 30, the upper ends of the elevation pins 28 can support the bottom of the substrate W.

Further, an upper electrode 55 is disposed above the stage 20. A second high-frequency power source 56 is connected to the upper electrode 55 through a matching box 57. The second high-frequency power source 56 is a power source generating second high-frequency power. The second high-frequency power has a frequency that is suitable for producing plasma. The upper electrode 55 is supported at an upper portion of a chamber 10 through an insulating member 60. The upper electrode 55 has a support body 58 and a ceiling plate 59. A gas diffusion room connected with the supply pipe 12 and a plurality of holes extending downward from the gas diffusion chamber are formed in the support body 58 and the ceiling plate 59, thereby constituting the gas introducer 13.

Further, heaters 10h2 that heat the gas introducer 13 are disposed in the support body 58.

The controller 40 controls the operation of the oxide film removing apparatus 100 by controlling the gate valve 10g, the heaters 10h1 and 10h2, the gas supply 11, the exhauster 15, the elevator 22 of the stage 20, the switch 26 of the electrostatic chuck 24, the coolant unit 27, the elevator 32 of the contact member 30, the first high-frequency power source 51, the second high-frequency power source 56, etc.

<Operation of Oxide Film Removing Apparatus 100>

Figure 3:
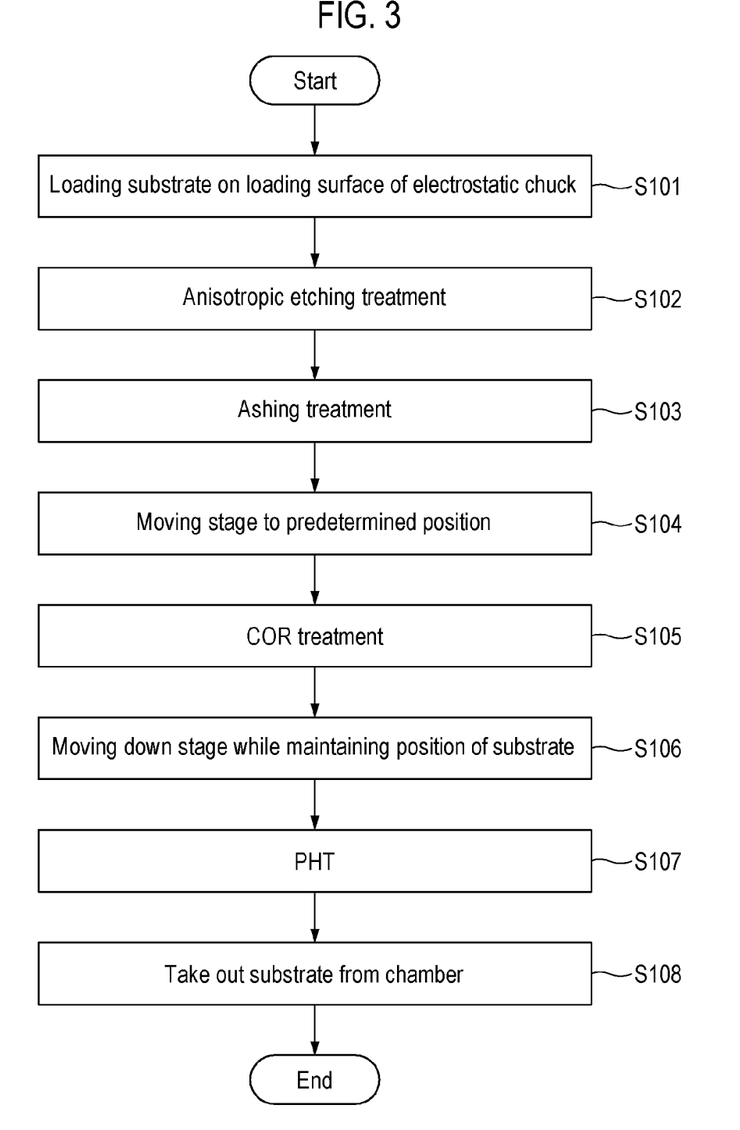
FIG. 3 is a flowchart showing an exemplary operation of the substrate treatment apparatus according to the first embodiment.
Figure 4A:
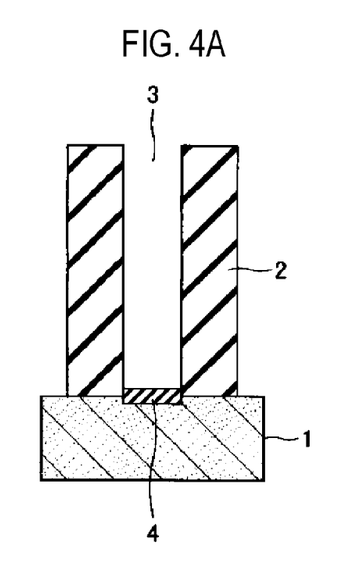
FIGS. 4A to 4C are schematic cross-sectional views showing the state of a substrate in respective processes.
Figure 4B:
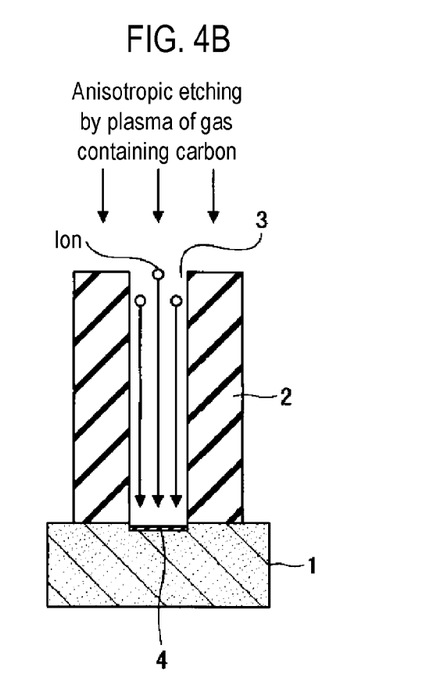
Figure 4C:
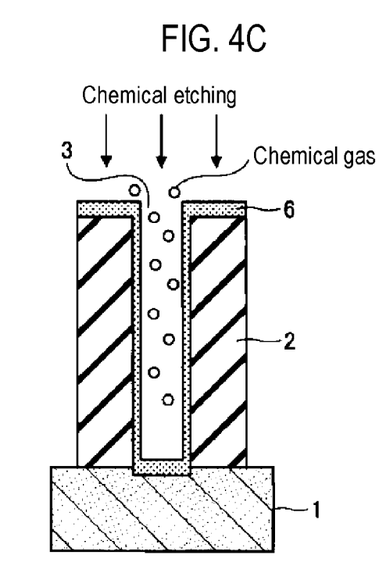
Figure 5A:
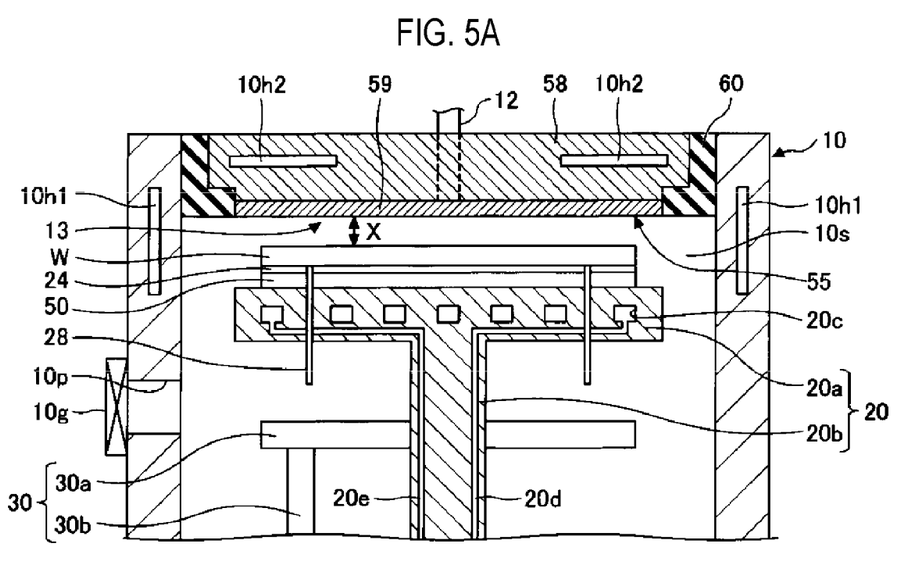
FIGS. 5A and 5B are schematic cross-sectional views showing the state of a substrate treatment apparatus in respective processes.
Figure 5B:
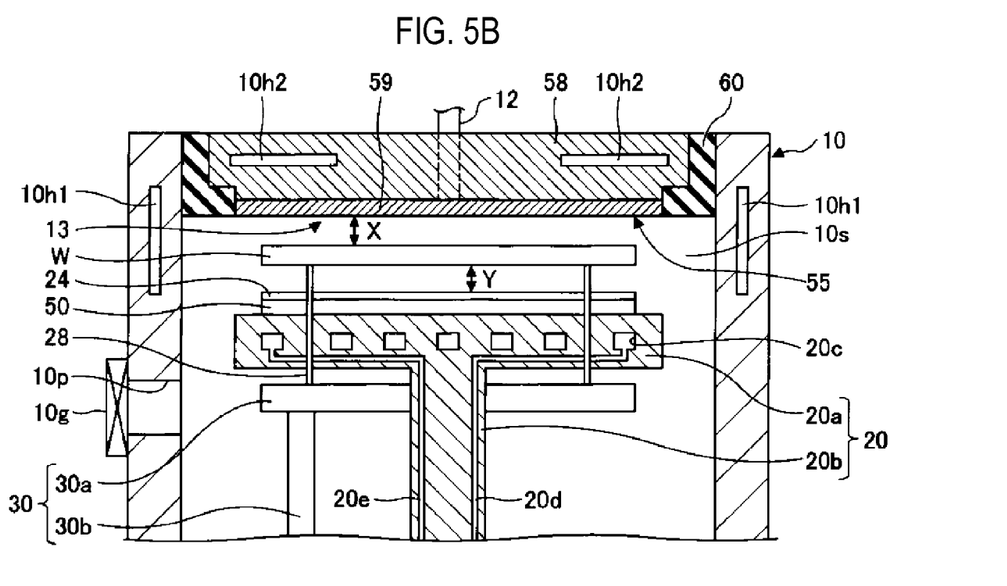

Next, the operation of the oxide film removing apparatus 100 according to the first embodiment is described with reference to FIGS. 3 to 5B. FIG. 3 is a flowchart showing an exemplary operation in the oxide film removing apparatus 100 according to the first embodiment. FIGS. 4A to 4C are schematic cross-sectional views showing states of a substrate W in respective processes. FIGS. 5A and 5B are schematic cross-sectional views showing a state of the oxide film removing apparatus 100 in respective processes.

First, as shown in FIG. 4A, a substrate W having an insulating film 2 on a silicon base 1 and having a trench 3 formed in a predetermined pattern in the insulating film 2 is prepared. A natural oxide film 4 is formed on a silicon portion at the bottom of the trench 3. The insulating film 2 is mainly configured with a $SiO_2$ film, but may partially have a SiN film. The substrate W is accommodated in, for example, a carrier C in an atmospheric atmosphere. The substrate W is fed from the carrier C by the feeders 306 and 308 to the oxide film-removing apparatus 100 through the atmospheric feed chamber 303, the load lock chamber 302, and the vacuum feed chamber 301.

In step S101, the controller 40 loads the substrate W onto the loading surface of the electrostatic chuck 24. Specifically, the controller 40 moves the stage 20 to a receiving position of the substrate W by controlling the elevator 22. The controller 40 opens the gate valve 10g. The substrate W is loaded into the internal space 10s of the chamber 10 by the feeder 306 (see FIG. 1). The controller 40 moves the elevation pins 28 up by controlling the elevator 32. Accordingly, the substrate W is supported by the elevation pins 28. When the feeder 306 is retracted from the passage 10p, the controller 40 closes the gate valve 10g. The controller 40 moves the elevation pins 28 down by controlling the elevator 32. Accordingly, the substrate W is loaded onto the loading surface of the electrostatic chuck 24. The controller 40 may load the substrate W onto the electrostatic chuck 24 by moving up the stage 20 by controlling the elevator 22. The controller 40 turns on the switch 26. Accordingly, the substrate W is retained on the loading surface of the electrostatic chuck 24.

In step S102, the controller 40 performs an anisotropic etching treatment (first oxide film removing treatment). In this process, as shown in FIG. 4B, the natural oxide film 4 on the bottom of the trench 3 is removed by ionic anisotropic etching by plasma of a gas (e.g., CxFy-based gas) containing carbon. This process is anisotropic etching which uses straightness characteristics of ions, in which, etching by attracting ions to the substrate W is performed by producing plasma from the gas supplied from the gas supply 11, using the first high-frequency power source 51 and the second high-frequency power source 56.

As the gas containing carbon, a fluorocarbon-based (CxFy-based) gas such as $CF_4$ or $C_4F_8$ may be appropriately used. A fluorinated hydrocarbon-based (CxHyFz-based) gas such as $CH_2F_2$ may be used. In addition to the above gases, it may be possible to contain a rare gas such as Ar gas, an inert gas such as $N_2$ gas, and a small amount of $O_2$ gas. A carbon-based protective film (not shown) is formed on the side walls of the trench 3 in anisotropic etching due to using such gases, so that it is possible to etch the natural oxide film 4 while suppressing progress of etching of the side walls. Accordingly, it is possible to remove most of the natural oxide film 4 at the bottom of the trench 3 while suppressing a CD loss.

In step S103, the controller 40 performs an ashing treatment. In this process, the carbon-based protective film (not shown) formed in the anisotropic etching treatment is removed by the ashing treatment.

In step S104, the controller 40 moves the stage 20 to a predetermined position. In this process, the stage 20 is moved closer to the gas introducer 13 than the position when the anisotropic etching treatment and the ashing treatment are performed. The positions of the substrate W, the stage 20, the elevation pins 28, and the contact member 30 in step S104 are shown in FIG. 5A. Specifically, the controller 40 moves the stage 20 to a predetermined position by controlling the elevator 22. The predetermined position is a position where the gas introducer 13 and the substrate W are brought close to each other, and for example, the substrate W is moved close to the gas introducer 13 such that the distance X from the bottom of the gas introducer 13 to the top of the substrate W becomes 3 to 10 mm.

In step S105, the controller 40 performs a COR treatment which is an example of chemical etching (second oxide film removing treatment). Herein, most of the natural oxide film 4 of the substrate W is removed by step S102 and step S103.

However, the natural oxide film 4 formed at the bottom of the trench 3 having a complicated shape such as a trench of a fin FET cannot be sufficiently removed only by an anisotropic etching treatment having the straightness characteristics of ions. Accordingly, the remainder of the natural oxide film 4 existing at the bottom of the trench 3 after the anisotropic etching treatment (first oxide film removing treatment) is removed by chemical etching (second oxide film removing treatment). The chemical etching is etching by a reactive gas which does not use plasma and is isotropic etching. Accordingly, it is possible to remove the natural oxide film 4 at the bottom of the trench 3 having a complicated shape. As the chemical etching, a COR treatment that uses $NH_3$ gas and HF gas as a chemical gas is suitable.

Specifically, the controller 40 decreases the pressure of the internal space 10s to a pressure lower than the atmospheric pressure (e.g., equal to or less than 1 Torr) by controlling the exhauster 15. The controller 40 supplies $NH_3$ gas and HF gas as a chemical gas into the internal space 10s from the gas introducer 13 by controlling the gas supply 11. It may be possible to supply an inert gas such as Ar gas or $N_2$ gas as a dilution gas. The positions of the substrate W, the stage 20, the elevation pins 28, and the contact member 30 are the same as the positions in step S104 shown in FIG. 5A.

Since chemical etching such as a COR treatment is isotropic etching, there is a concern that the side walls of the trench 3 may also be etched and a CD loss may be generated, but since only the natural oxide film 4 slightly remaining at the bottom of the trench 3 is removed in step S105, it may be a treatment of short time duration, and actually, there is little CD loss for the most part.

As shown in FIG. 4C, a reaction product 6 mainly containing ammonium fluorosilicate (($NH_4)_2SiF_6$) (AFS) is formed on the top surface of the insulating film 2 and the bottom of the trench 3 by reaction with $NH_3$ gas and HF gas after the COR treatment.

In order to prevent the reaction product 6 produced by the COR treatment from adhering to the side walls of the chamber 10 or the gas introducer 13, the side walls of the chamber 10 and the gas introducer 13 have been heated (e.g., about 100 degrees C.) by the heaters 10h1 and 10h2.

Further, the substrate W is retained on the electrostatic chuck 24 of the stage 20. Accordingly, the temperature of the substrate W is determined by the temperature adjuster of the stage 20 (the coolant unit 27, etc.) and is controlled to reach a predetermined target temperature (e.g., about 20 to 90 degrees C.). The temperature of the substrate W may be close to room temperature in terms of damage to the shape of the substrate W. Further, the temperature of the substrate W may be, for example, higher than 65 degrees C. in terms of improving throughput by efficiently removing the reaction product 6 at the bottom in the hole of the trench 3.

The silicon oxide formed on the substrate W reacts with the treatment gas (hydrogen fluoride gas and ammonia gas) to produce ammonium fluorosilicate as a reaction product. The sublimation temperature of the ammonium fluorosilicate is about 100 degrees C. and the reaction product is deposited on the substrate W.

In step S106, the controller 40 lowers the stage 20 while the substrate W is maintained at the position (i.e., the distance X from the bottom of the gas introducer 13 to the top of the substrate W is maintained). The positions of the substrate W, the stage 20, the elevation pins 28, and the contact member 30 in step S106 are shown in FIG. 5B. Specifically, the controller 40 controls the elevator 32 of the contact member 30 such that the top surface of the contact member 30 comes in contact with the lower ends of the elevation pins 28 and the upper ends of the elevation pins 28 come in contact with the bottom surface of the substrate W (in other words, the distance X from the bottom of the gas introducer 13 to the top of the substrate W is maintained by the elevation pins 28). Further, the controller 40 turns off the switch 26. Accordingly, the substrate W retained by the electrostatic chuck 24 is released. The controller 40 lowers the stage 20 by controlling the elevator 22 of the stage 20. The distance Y between the top surface of the stage 20 (the electrostatic chuck 24) that has been lowered and the bottom surface of the substrate W, for example, may be the same as or more than the distance X from the bottom surface of the gas introducer 13 to the top surface of the substrate W.

In step S107, the controller 40 performs a PHT. The PHT is a treatment that sublimates and removes the reaction product 6 produced in the COR treatment in step S105. Specifically, in a nitrogen atmosphere, the reaction product 6 is sublimated by treating the reaction product 6 at the sublimation temperature of the reaction product 6 for a specific time, thereby removing the reaction product 6 from the substrate W.

Specifically, the controller 40 sets the pressure of the internal space 10s to a predetermined pressure (e.g., equal to or less than 10 Torr) by controlling the exhauster 15. The controller 40 supplies nitrogen gas into the internal space 10s from the gas introducer 13 by controlling the gas supply 11. The positions of the substrate W, the stage 20, the elevation pins 28, and the contact member 30 are the same as the positions in step S106 shown in FIG. 5B.

In this state, the substrate W and the stage 20 are spaced apart from each other. The side walls of the chamber 10 and the gas introducer 13 have been heated by the heaters 10h1 and 10h2. Accordingly, the substrate W is heated by the heat transfer through the nitrogen gas from the side walls of the chamber 10 and the gas introducer 13. Thus, the reaction product deposited on the substrate W is sublimated. The sublimated reaction product is discharged out of the internal space 10s together with the nitrogen gas by the exhauster 15.

In step S108, the controller 40 takes out the substrate W from of the chamber 10. For example, the controller 40 opens the gate valve 10g. The feeder 306 is inserted into the chamber 10. The controller 40 lowers the elevation pins 28 by controlling the elevator 32. Accordingly, the substrate W is transferred to the feeder 306 from the elevation pins 28. When the feeder 306 holding the substrate W is retracted from the passage 10p, the controller 40 closes the gate valve 10g.

According to the oxide film-removing apparatus 100 of the first embodiment described above, it is possible to perform an anisotropic etching treatment, an ashing treatment, a COR treatment (isotropic etching treatment), and a PHT for removing the natural oxide film 4 formed on the substrate W in one chamber 10.

In the COR treatment, as shown in FIG. 5A, the temperature of the substrate W has been adjusted to a predetermined target temperature (e.g., 30 degrees C.) by the temperature adjuster of the stage 20. Accordingly, etching of silicon oxide is facilitated, and a reaction product can be produced in a satisfactory manner.

In the PHT, as shown in FIG. 5B, since the stage 20 is separated from the substrate W by lowering only the stage 20, it is possible to heat the substrate W over the sublimation temperature of the reaction product using the gas introducer 13 or the side walls of the chamber 10 as a heat source while maintaining the substrate W at a predetermined position from the gas introducer 13.

In step S104, the stage 20 is moved close to the gas introducer 13 in the above description, but the present disclosure is not limited thereto. For example, it may be possible to heat the substrate W using radiation heat by heating the side walls of the chamber 10 and the gas introducer 13 to 150 degrees C. or higher using the heaters 10h1 and 10h2. In this case, it may be possible to omit step S104 and move on to step S105.

Second Embodiment

Next, a contact forming system 300 according to a second embodiment is described. The contact forming system 300 according to the second embodiment is different in the oxide film removing apparatus 100 from the contact forming system 300 according to the first embodiment. Further, the state of a substrate W accommodated in a carrier C is different.

<Oxide Film Removing Apparatus 100A>

Figure 6:
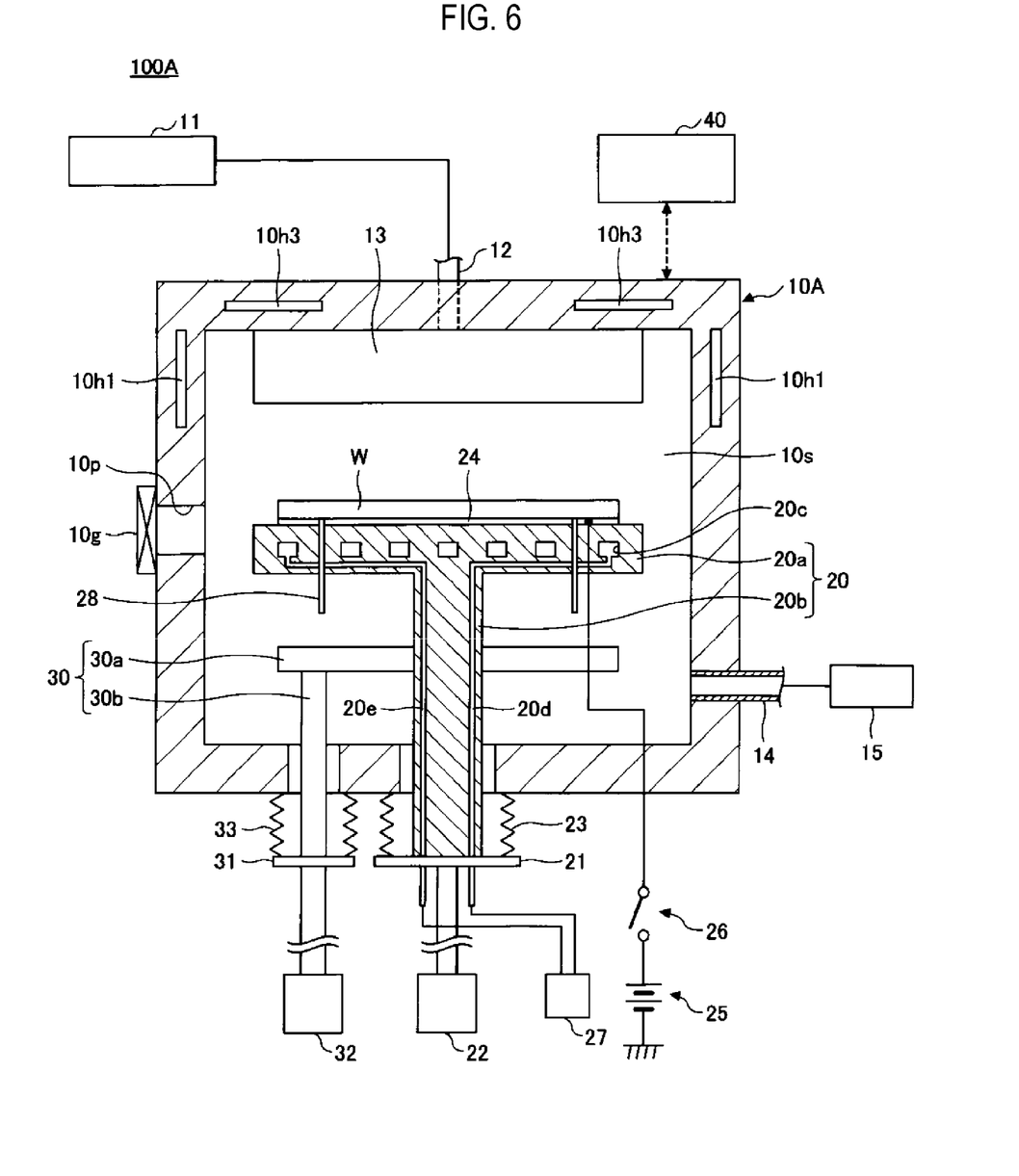
FIG. 6 is an exemplary schematic cross-sectional view of a substrate treatment apparatus according to a second embodiment.

An example of the configuration of an oxide film removing apparatus 100A according to the second embodiment is described with reference to FIG. 6. FIG. 6 is an exemplary schematic cross-sectional view of the oxide film removing apparatus 100A according to the second embodiment. The oxide film removing apparatus 100A shown in FIG. 6 is an apparatus that removes a natural oxide film 4 formed on the surface of a silicon portion before the metal film forming apparatus 200 forms a contact by forming a film of contact metal on the silicon portion at the bottom of a trench 3 of a substrate W. The oxide film removing apparatus 100 performs a COR treatment for removing the natural oxide film 4 and a PHT for removing a reaction product 6 produced by the COR treatment in one chamber 10.

The oxide film removing apparatus 100A includes a chamber 10A. The chamber 10A is installed with a heater 10h1 that heats the side walls of the chamber 10A and a heater 10h3 that heats the gas introducer 13 by heating the upper portion of the chamber 10A.

The oxide film removing apparatus 100A does not perform plasma treatment, so that it does not include the lower electrode 50, the first high-frequency power source 51, the matching box 52, the upper electrode 52, the second high-frequency power source 56, the matching box 57, the support 58, the ceiling plate 59, the insulating member 60, etc.

<Operation of Oxide Film Removing Apparatus 100A>

Figure 7:
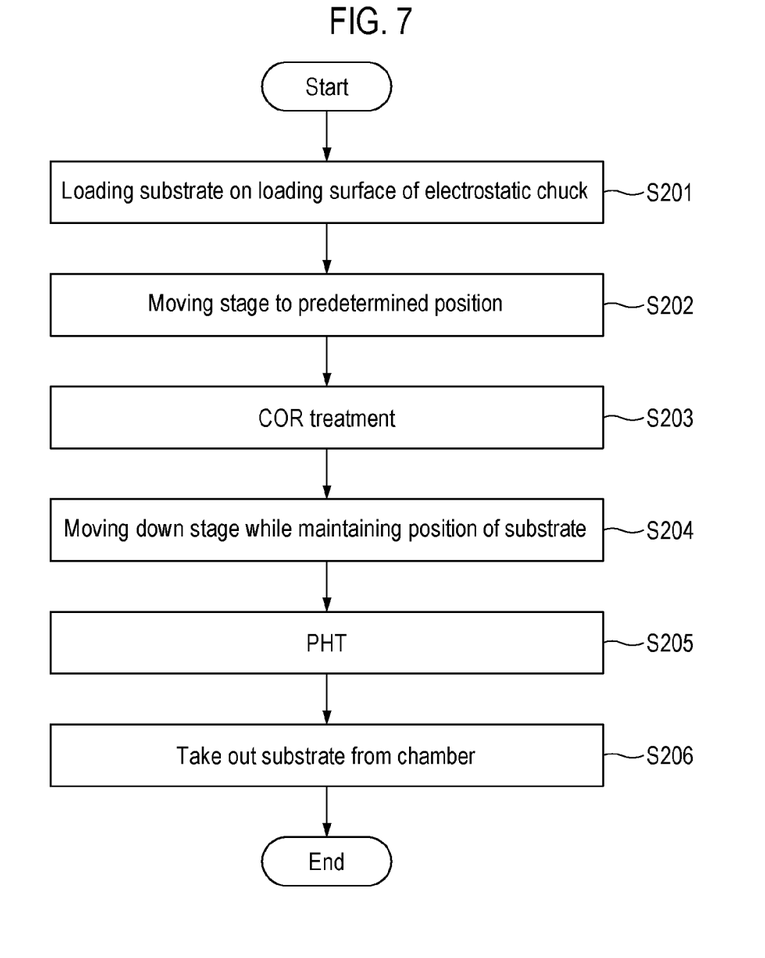
FIG. 7 is a flowchart showing an exemplary operation of the substrate treatment apparatus according to the second embodiment.

Next, the operation of the oxide film removing apparatus 100A according to the second embodiment is described with reference to FIG. 7. FIG. 7 is a flowchart showing an exemplary operation in the oxide film removing apparatus 100A according to the second embodiment.

First, as shown in FIG. 4B, a substrate W that has undergone an anisotropic etching treatment and an ashing treatment is prepared. The substrate W is accommodated, for example, in a carrier C in an atmospheric atmosphere. The substrate W is fed from the carrier C by the feeders 306 and 308 to the oxide film removing apparatus 100A through the atmospheric feed chamber 303, the load lock chamber 302, and the vacuum feed chamber 301.

In step S201, the controller 40 loads the substrate W onto the loading surface of the electrostatic chuck 24. Detailed operation is the same as that in step S101 shown in FIG. 3, and thus a repeated description is omitted.

In step S202, the controller 40 moves the stage 20 to a predetermined position. The predetermined position, similar to the state in step S104 shown in FIG. 5A, is a position where the gas introducer 13 and the substrate W are close to each other, and for example, the substrate W is moved close to the gas introducer 13 such that the distance X from the bottom surface of the gas introducer 13 to the top surface of the substrate W becomes 3 to 10 mm.

In step S203, the controller 40 performs a COR treatment. In step S204, the controller 40 lowers the stage 20 while the substrate W is maintained at the position (i.e., the distance X between the bottom surface of the gas introducer 13 to the top surface of the substrate W is maintained). In step S205, the controller 40 performs a PHT. In step S206, the controller 40 takes out the substrate W from of the chamber 10. Detailed operation is the same as that in step S105 to step S108 shown in FIG. 3, and thus a repeated description is omitted.

According to the oxide film removing apparatus 100A of the second embodiment described above, it is possible to perform a series of treatments (a COR treatment and a PHT) in one chamber 10A.

In step S202, the stage 20 is moved close to the gas introducer 13 in the above description, but the present disclosure is not limited thereto. For example, it may be possible to heat the substrate W using radiation heat by heating the side walls of the chamber 10 and the gas introducer 13 to 150 degrees C. or higher using the heaters 10h1 and 10h3. In this case, it may be possible to omit step S202 and move on to step S203.

According to an aspect, it is possible to provide a method of controlling a substrate treatment apparatus, a substrate treatment apparatus, and a cluster system which remove an oxide produced on a substrate in one chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling a substrate treatment apparatus including a chamber, a stage having elevation pins, a gas introducer disposed above the stage and introducing a treatment gas into the chamber, a first heating source heating the gas introducer, a stage elevator moving the stage up/down, and an elevator for elevation pins moving the elevation pins up/down, the method comprising:
   supporting a substrate having an oxide on the stage;
   etching the oxide using a treatment gas by supplying the treatment gas from the gas introducer;
   moving down the stage while maintaining a position of the substrate using the elevation pins; and
   sublimating a reaction product produced in etching the oxide by the first heating source.

2. The method of claim 1, wherein the substrate treatment apparatus further comprises a temperature adjuster adjusting a temperature of the stage, and
   the etching the oxide comprises adjusting a temperature of the substrate by the temperature adjuster.

3. The method of claim 2, wherein the substrate treatment apparatus further comprises a second heating source heating the chamber, and
   the sublimating the reaction product comprises sublimating the reaction product by the first heating source and the second heating source.

4. The method of claim 3, further comprising moving the stage close to the gas introducer after the supporting of the substrate.

5. The method of claim 4, wherein the moving the stage close to the gas introducer comprises moving the stage such that a distance between the gas introducer and the substrate is in a range of 3 mm or more and 10 mm or less.

6. The method of claim 5, wherein the supporting the substrate, the etching the oxide, the moving down the stage, and the sublimating the reaction product are performed in a same chamber.

7. The method of claim 6, wherein the first heating source and the second heating source heat the substrate by radiation heat.

8. The method of claim 7, further comprising:
performing a plasma etching treatment on the substrate by plasma of gas containing carbon; and
ashing a protective film formed by the plasma etching treatment.

9. The method of claim 8, wherein the plasma etching treatment and the ashing the protective film are performed in the same chamber.

10. The method of claim 9, wherein a temperature of the stage is a temperature higher than 65 degrees C.

11. The method of claim 1, wherein the substrate treatment apparatus further comprises a second heating source heating the chamber, and
the sublimating the reaction product comprises sublimating the reaction product by the first heating source and the second heating source.

12. The method of claim 1, further comprising moving the stage close to the gas introducer after the supporting of the substrate.

13. The method of claim 1, wherein the supporting the substrate, the etching the oxide, the moving down the stage, and the sublimating the reaction product are performed in a same chamber.

14. The method of claim 1, wherein the first heating source heats the substrate by radiation heat.

15. The method of claim 1, further comprising:
performing a plasma etching treatment on the substrate by plasma of gas containing carbon; and
ashing a protective film formed by the plasma etching treatment.

16. The method of claim 1, wherein a temperature of the stage is a temperature higher than 65 degrees C.

17. The method of claim 1, wherein a distance between the stage moved in the moving-down the stage and the substrate is equal to or larger than a distance between the stage and the gas introducer in the etching.

18. A substrate treatment apparatus comprising:
a chamber;
a stage having elevation pins;
a gas introducer disposed above the stage and introducing a treatment gas into the chamber;
a first heating source heating the gas introducer;
a stage elevator moving up/down the stage;
an elevation pin elevator moving up/down the elevation pins; and
a controller
wherein the controller is configured to:
support a substrate having an oxide on the stage;
etch the oxide using a treatment gas by supplying the treatment gas from the gas introducer;
move down the stage while maintaining a position of the substrate using the elevation pins; and
sublimate a reaction product produced in the etching the oxide by the first heating source.

19. A cluster system comprising:
the substrate treatment apparatus of claim 18;
a metal film forming apparatus forming a metal film; and
a vacuum feed chamber connecting the substrate treatment apparatus and the metal film forming apparatus.

20. The cluster system of claim 19, wherein a treatment on the substrate by the substrate treatment apparatus and a treatment of forming a metal film on the substrate by the metal film forming apparatus are performed without breaching vacuum.

* * * * *